(12) United States Patent
Dewdney

(10) Patent No.: US 6,765,382 B2
(45) Date of Patent: Jul. 20, 2004

(54) SHIMMED FACILITY AND SHIMMING METHOD EMPLOYING MULTIPLE ROLLING BODIES NON-FIXEDLY POSITIONED IN A TUBE

(75) Inventor: Andrew Dewdney, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/255,383

(22) Filed: Sep. 26, 2002

(65) Prior Publication Data

US 2003/0085704 A1 May 8, 2003

(30) Foreign Application Priority Data

Sep. 28, 2001 (DE) .......................... 101 47 984

(51) Int. Cl.[7] ................................. G01V 3/00
(52) U.S. Cl. ....................... 324/320; 324/318
(58) Field of Search ..................... 324/300, 307, 324/309, 318, 320, 322, 319; 335/301

(56) References Cited

U.S. PATENT DOCUMENTS

| | | | |
|---|---|---|---|
| 4,680,551 A | | 7/1987 | O'Donnell et al. |
| 5,003,276 A | * | 3/1991 | Sarwinski et al. ........... 335/304 |
| 5,047,720 A | | 9/1991 | Guy |
| 5,349,297 A | * | 9/1994 | DeMeester et al. ......... 324/318 |
| 5,400,786 A | | 3/1995 | Allis |
| 5,431,165 A | | 7/1995 | Sellers |
| 5,532,597 A | * | 7/1996 | McGinley et al. .......... 324/319 |
| 5,627,471 A | * | 5/1997 | Kinanen ..................... 324/319 |
| 5,635,839 A | * | 6/1997 | Srivastava et al. .......... 324/320 |
| 5,864,275 A | | 1/1999 | Ohashi et al. |
| 5,923,235 A | * | 7/1999 | Van Oort ..................... 335/301 |
| 5,963,117 A | | 10/1999 | Ohashi et al. |
| 5,999,076 A | * | 12/1999 | Becker et al. .............. 335/301 |
| 6,002,255 A | | 12/1999 | Pulyer |
| 6,150,911 A | * | 11/2000 | Katznelson et al. ........ 335/299 |
| 6,218,839 B1 | | 4/2001 | Shaikh et al. |
| 6,275,128 B1 | * | 8/2001 | Aoki et al. ................. 335/299 |
| 6,294,972 B1 | * | 9/2001 | Jesmanowicz et al. ...... 335/301 |
| 6,538,545 B2 | * | 3/2003 | Wakuda et al. ............. 335/296 |
| 6,566,991 B1 | * | 5/2003 | Rimkunas et al. .......... 335/301 |
| 2003/0011456 A1 | * | 1/2003 | Yoshida et al. ............. 335/299 |

FOREIGN PATENT DOCUMENTS

| | | |
|---|---|---|
| DE | 199 01 331 | 7/2000 |
| EP | 0 677 751 | 10/2000 |

OTHER PUBLICATIONS

"Bildgebende Systeme für die Medizinische Diagnostik," 3rd Edition, Morneburg, Ed. (1995) p. 520.

* cited by examiner

Primary Examiner—Diego Gutierrez
Assistant Examiner—Dixomara Vargas
(74) Attorney, Agent, or Firm—Schiff Hardin LLP

(57) ABSTRACT

A facility for generating a uniform magnetic field, particularly for generating a basic magnetic field of a magnetic resonance examination apparatus, particularly a medical magnetic resonance tomography apparatus, has a shim device with a guide device to or in which a number of ferromagnetic articles, such as balls, are movably attached. At least two of the articles have ferromagnetic properties differing from one another, such as saturation magnetizations that differ in magnitude from one another. A method for improving the homogeneity of a magnetic field makes use of such a facility.

26 Claims, 4 Drawing Sheets

SHIMMED FACILITY AND SHIMMING METHOD EMPLOYING MULTIPLE ROLLING BODIES NON-FIXEDLY POSITIONED IN A TUBE

BACKGROUND OF THE INVENTION

1. Field of the Invention

The present invention is directed to a facility for generating a uniform magnetic field, particularly for generating a basic magnetic field in a magnetic resonance examination apparatus, particularly a medical magnetic resonance tomography apparatus, of the type having a shim device for improving the homogeneity of the magnetic field. The invention also is directed to a magnetic resonance examination apparatus and to a set of ferromagnetic articles for use in shimming. Further, the invention is directed to a method for improving the homogeneity of a magnetic field, particularly the magnetic basic field in a magnetic resonance examination apparatus, particularly a medical magnetic resonance tomography apparatus, of the type wherein multiple ferromagnetic articles are introduced into the magnetic field for influencing the field.

2. Description of the Prior Art

The basic principles relating to shimming a magnetic field are described in conjunction with nuclear magnetic resonance tomography in, for example, the book by Heinz Morneburg, "Bildgebende Systeme für die medizinische Diagnostik," 3rd edition, 1995, page 520. "Shimming" means the elimination of basic field inhomogeneities caused by manufacturing tolerances and ferromagnetic articles distributed in the environment of the tomography apparatus.

To this end, for example, the field is first measured using at least one probe in an adequate number of pickup locations uniformly distributed on the surface of the spherical homogeneity volume. The field values are entered into a computing program that calculates a suitable arrangement of iron plates to be attached in the magnet bore or cylindrical tube. A check measurement also is implemented after assembly. This procedure usually must be repeated once or twice until a satisfactory shim result has been achieved.

It is also possible to homogenize the field with correction coils or shim coils (active shimming). Methods and devices of this type are disclosed, for example, in U.S. Pat. Nos. 4,680,551 and 6,002,255.

The introduction of iron plates or differently shaped pieces of iron is referred to as passive shimming. As disclosed in U.S. Pat. No. 5,400,786, an annular shim mechanism can be attached in the inside of the cylinder pipe given a magnetic resonance examination apparatus with a cylindrical device for generating the magnetic basic field (closed system).

U.S. Pat. No. 5,431,165 discloses the attachment of shim devices to the upper pole shoe and to the lower pole shoe for an open magnet system.

European Application 0 677 751 discloses the use of correction rings for shimming formed by windings of a number of turns of iron or steel that are electrically insulated from one another. Eddy currents generated by the gradient coils of the magnetic resonance tomography apparatus are to be minimized as a result.

U.S. Pat. No. 6,218,839 B1 and PCT Application WO 88/08126 disclose inserts for introduction into the opening of a magnetic resonance tomography apparatus that are employed for shimming. The inserts have pockets at predefined locations into which an iron piece can be placed or the pocket can be left empty, as needed.

SUMMARY OF THE INVENTION

An object of the present invention is to provide a shimming facility a method with which a magnetic field can be even more precisely homogenized than with known devices and methods.

This object is achieved in a facility for generating a uniform magnetic field, having a shim mechanism with a guide device attachable in the region of the magnetic field which carries a number of ferromagnetic articles in a movable manner. The ferromagnetic articles can be movably attached to or in the guide element. The guide device, along which the ferromagnetic articles are movable, makes it possible to select the positions at which a ferromagnetic article should or can be introduced more freely than in known devices. In particular, it is not necessary to provide pocket-forming spacers or the like between the ferromagnetic articles. After the ferromagnetic articles have been moved to the desired position along the guide device, they can be fixed in this position. Suitable fixing elements can be present for this purpose.

In particular, the shim mechanism is present in the facility separately from the magnet system for originally generating the magnetic field, for example a coil or a permanent magnet.

The fixing of the ferromagnetic articles at their desired location in or at the guide device can occur by means of so many ferromagnetic articles and, possibly, non-ferromagnetic articles as well, being attached at or in the guide device so that the articles touch one another, so that a specific article is held by at least two neighboring articles that can be ferromagnetic or non-ferromagnetic. In this case, it suffices to fix only the articles present at the end of the guide device with a separate fixing arrangement. The guide device can be linear.

The ferromagnetic and/or non-ferromagnetic articles can be fashioned as gliding or rolling bodies that can be displaced or rolled along the guide device.

In a preferred embodiment, the ferromagnetic articles, and the non-ferromagnetic articles which may be optionally present as spacers between two ferromagnetic articles are implemented as balls, and the guide device is a pipe or tube for accepting the balls. For example, the outside diameter of the balls is matched to the inside diameter of the tube.

In another preferred embodiment, at least two articles having ferromagnetic properties differing from one another, particularly having saturation magnetizations that differ in magnitude from one another, are attached to or introduced into the guide device.

This especially preferred embodiment has the advantage that an especially good homogenization of the magnetic field is possible. In the known devices for homogenizing the magnetic field, there is only the degree of freedom in the optimization of introducing or not introducing a ferromagnetic article, for example a shim plate, at a specific, predefined position. This quasi-digital situation (0 or 100%) leads to unavoidable rounding errors during the optimization. The idea of resolving the quasi-digital situation with magnetic properties of differing intensities is particularly advantageous in conjunction with the employment of balls guided in a tube as ferromagnetic articles, since the use of balls of different sizes would thereby not be practical. The idea of employing articles having different ferromagnetic properties for the shimming leads—in addition to the guide device—to a further degree of freedom in the optimization during the shimming. The position of an influencing article as well as the strength of its influence on the magnetic field thus can be more freely selected than with known devices.

The idea of setting the strength of the influence of an article employed for shimming on the basis of its ferromagnetic properties also can be employed independently of whether the articles are movable along a guide device. Instead of being movable in or at a guide device, such articles could also be attached immobile in pre-fixed positions of a carrying structure of some type or other.

Preferably, the shim mechanism has a set of a number of ferromagnetic articles allocated to it from which ferromagnetic articles can be selected as needed for attachment to or, respectively, introduction into the guide device. The set contains a number of types of article, with each type having a magnitude of a ferromagnetic property different from the other type or types, particularly a different magnitude of the saturation magnetization.

In particular, the magnitude of the ferromagnetic property changes in equidistant steps from one type to the next. For example, the types represent a saturation magnetization of 0% (non-ferromagnetic article), 20%, 40%, 60%, 80% and 100% of a specific absolute value.

For realizing different ferromagnetic properties, the articles have material compositions that differ from one another, for example, different alloys, particularly different alloys of iron, and/or nickel and/or cobalt.

Different grades of steel also can be utilized.

The aforementioned object also is achieved in accordance with the invention in a magnetic resonance examination apparatus having a facility for generating a uniform magnetic field as described above. In this case, the facility serves the purpose of generating the basic magnetic field of the magnetic resonance examination apparatus.

The above object also is achieved according to the invention by a set of a number of ferromagnetic articles for employment with a shim device, particularly with a shim device of a magnetic resonance examination apparatus, the set containing a number of types of identically shaped articles, each type exhibiting a magnitude of a ferromagnetic property different from the other type or types, particularly a different magnitude of the saturation magnetization. Because the articles have the same shape, they are easily suitable for each other.

To this end, the articles are also preferably of the same size.

Also preferably, the magnitude of the ferromagnetic property changes in equidistant steps from one type to the next.

In particular, the articles have material compositions that are different from one another.

The above object also is inventively achieved in a method including the steps of providing at least two articles having ferromagnetic properties that differ from one another, particularly having saturation magnetizations differing in magnitude from one another, and introducing the articles into the magnetic field.

Articles having the same shape and/or the same size are thereby preferably employed in the method.

In particular, the articles can be provided with material compositions that differ from one another.

The preferred embodiments and advantages presented in conjunction with articles having ferromagnetic properties differing from one another in conjunction with the facility of the invention for generating a magnetic field apply analogously to the method of the invention.

In an embodiment of the method wherein a measured field distribution is identified, a field distribution that is optimized in homogeneity is calculated, with the magnetic properties of the available articles and, optionally, the number and/or the positions of the articles in the magnetic field being employed as optimization parameters, and wherein respective articles having the calculated magnetic property are introduced into the magnetic field at prescribed positions or at positions calculated in this way.

Preferably in the optimization proceeds on the basis of more than two different types of article being available, with each type having a magnitude of a ferromagnetic property that is different from the other type or types, particularly a different magnitude of the saturation magnetization.

Particularly the optimization proceeds on the basis that the magnitude of the ferromagnetic properties changes in equidistant steps from one type to another.

DESCRIPTION OF THE PREFERRED EMBODIMENTS

Figure 1:
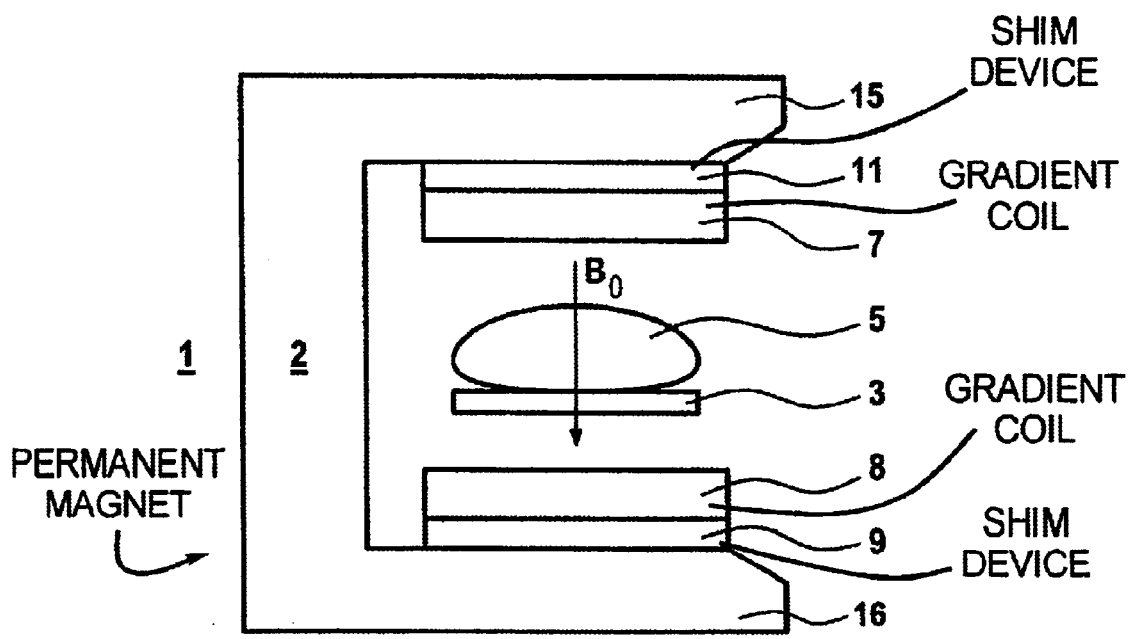
FIG. 1 illustrates a first exemplary embodiment of a magnetic resonance examination apparatus of the invention.

FIG. 1 shows an open magnetic resonance examination apparatus 1 having a permanent magnet 2 with pole shoes 15, 16 between which a patient 5 can be introduced on a support plate 3. During the examination, the patient 5 is penetrated by a vertical magnetic field $B_0$ referred to as a basic magnetic field in conjunction with magnetic resonance tomography. An especially homogeneous magnetic field $B_0$ is desirable for a good image quality in the evaluation of the acquired image of the patient 5.

Shim devices 9, 11 are present for homogenizing the magnetic field $B_0$, these being arranged between the pole shoes 16 or 15 and the gradient coils 8 or 7 that are present for generating a gradient field.

Figure 2:
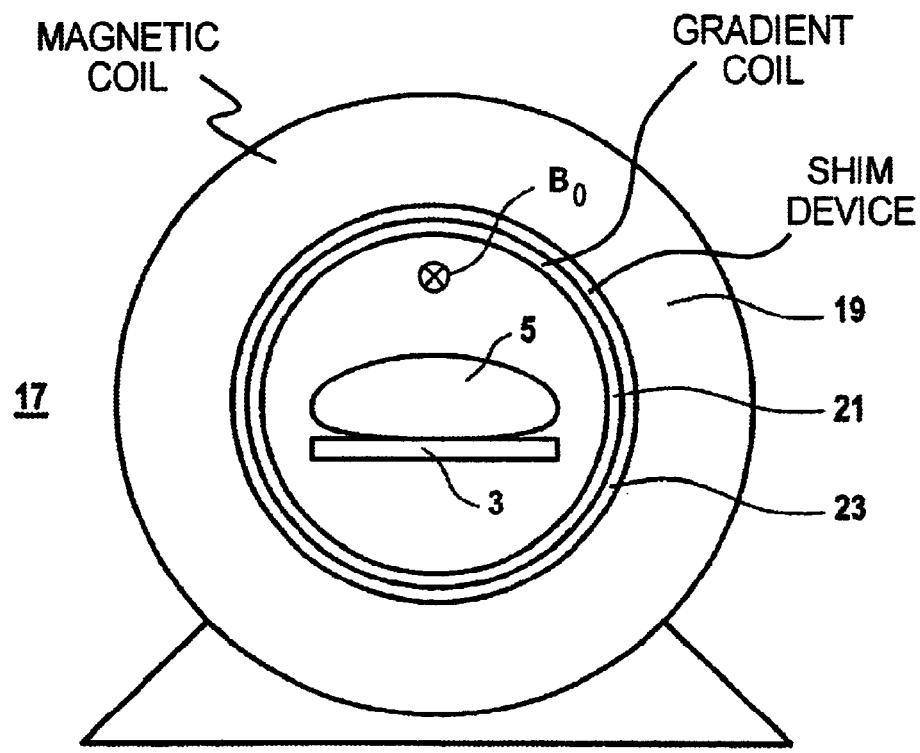
FIG. 2 illustrates a second exemplary embodiment of a magnetic resonance examination apparatus of the invention.

FIG. 2 shows a second exemplary embodiment of a magnetic resonance examination apparatus 17 of the invention that has a cylindrical magnetic coil 19 for generating the horizontal magnetic field $B_0$, the patient 5 being introducible into the opening ("bore") thereof on a support plate 3. A cylindrical shim device 23 is arranged between the magnetic coil 19 and a gradient coil 21.

The respective arrangements for generating the magnetic field $B_0$, i.e. the permanent magnet 2 with the pole shoes 15, 16, the magnetic coil 19, together with the shim devices 9, 11, or 23, form a facility of the invention for generating a uniform magnetic field.

The shim devices 9, 11, 23 of the magnetic resonance examination apparatus 1, 17 of FIGS. 1 and 2 have at least one tube into which ferromagnetic balls and, optionally, non-ferromagnetic balls can be introduced. In the shim devices 9, 11 according to FIG. 1, such a tube proceeds in a plane along the outside surfaces of the respective pole shoes 15, 16 and perpendicular to the magnetic field $B_0$. This is explained below on the basis of FIG. 3.

In an analogous way that is not explicitly shown, such a tube in the shim device 23 according to FIG. 2 proceeds parallel to the magnetic field $B_0$ or coils around the patient 5. The examples presented below for the shim device 9 of FIG. 1 analogously apply to the exemplary embodiment of FIG. 2, particularly in view of the different ferromagnetic properties of the articles guided in the tube.

Figure 3:
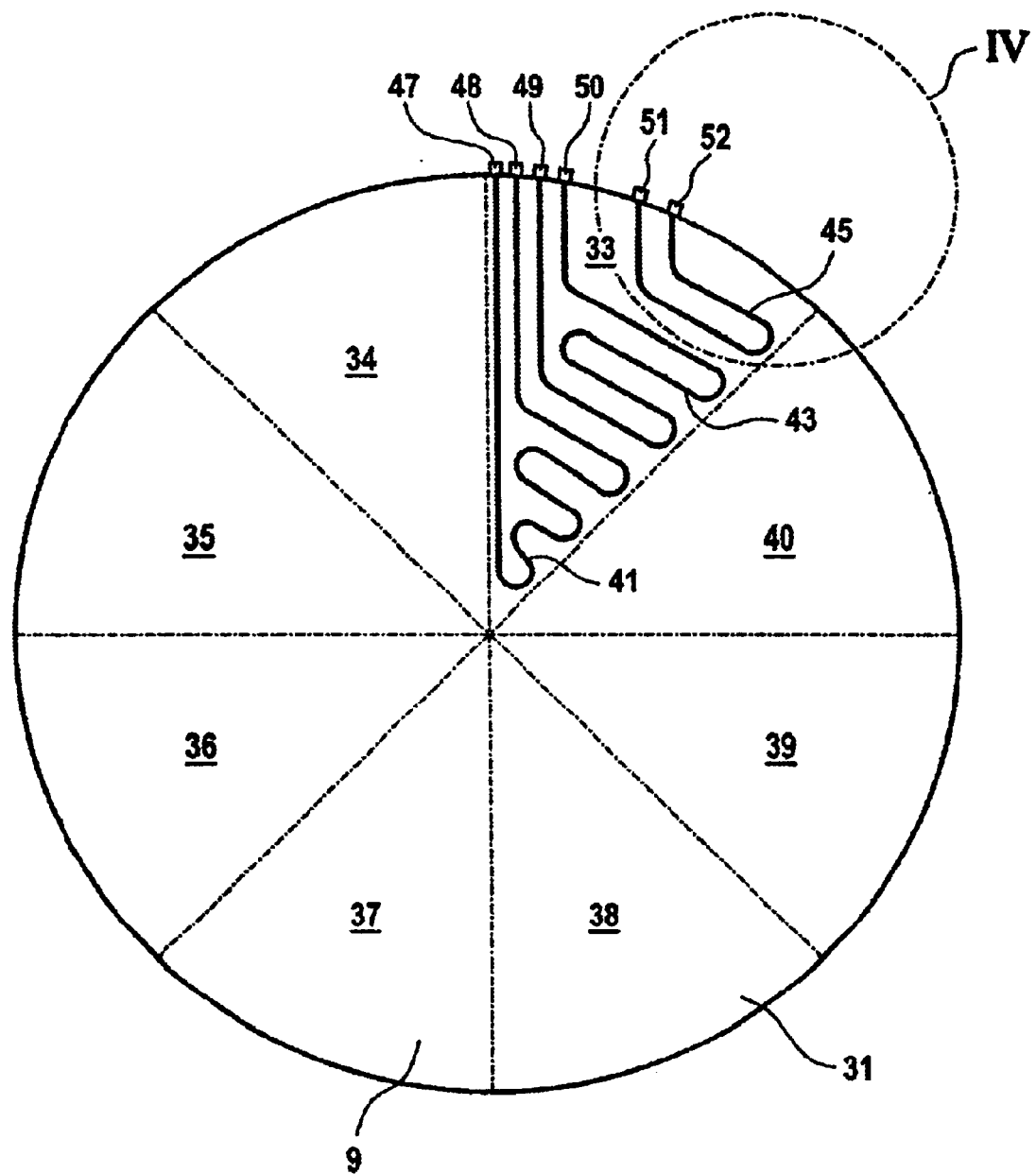
FIG. 3 illustrates a shim device of the magnetic resonance examination apparatus of FIG. 1 in detail in a plan view.

As shown in FIG. 3, the shim device 9 has a circular planar carrier 31 with eight sectors 33, 34, 35, 36, 37, 38, 39, 40. In each sector a number of tubes are secured which proceed along curved paths. Only the tubes 41, 43, 45 of the sector 33 are explicitly shown. The tubes 41, 43, 45 are each conducted through the sector 33 in a number of turns, with their ends terminating at the outside circumference of the carrier 31. The tubes 41, 43, 45 have filling connectors 47 and 48, 49 and 50, and 51 and 52 at ends, respectively. The tubes proceed in the sectors 33, 34, 35, 36, 37, 38, 39, 40 so that substantially the entire area of the carrier 31 is uniformly traversed by tubes.

Figure 4:
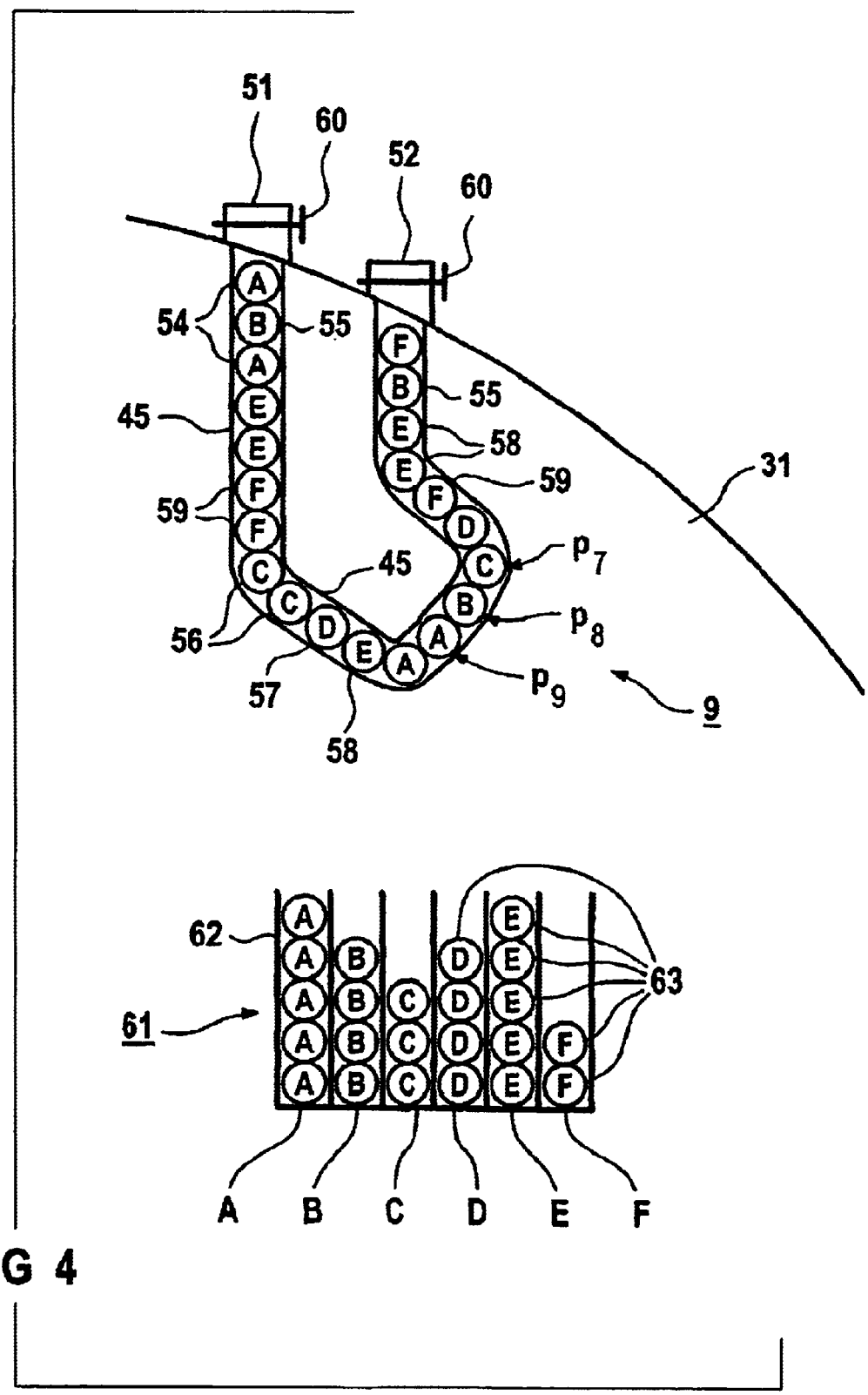
FIG. 4 is the excerpt referenced IV in FIG. 3, shown enlarged, in a magnified view together with a set of a number of ferromagnetic articles of the invention.

Further explanation is provided on the basis of FIG. 4 for the portion of the tube 45 designated in FIG. 3 and having the filling connectors 51, 52. A number of ferromagnetic articles 54, 55, 56, 57, 58, 59 implemented as balls have been filled into the tube 45 via the filling connectors 51, 52 until the tube 45 has been completely filled. The balls are freely movable within the tube 45 and along it. Their outside diameter corresponds to the inside diameter of the tube 45. After filling the desired number and type of balls into the tube 45, the latter can be closed with a closure 60 (schematically shown) such that the balls can no longer move in the tube 45. The positions pi of the balls in the tube 45 are freely selectable due to the corresponding design of the closure 60 or due to the introduction of small spacers of variable size between the closure 60 and the first ball in the tube 45. n=21 positions are provided in the illustrated example.

The number of positions n as well as the spatial attitude of the positions $p_i$ (i=1 . . . ; n: counting index) are freely selectable in the optimization of the homogeneity of the magnetic field $B_0$.

For improving the optimization of the homogenization of the magnetic field $B_0$, balls having ferromagnetic properties $M_i$ that differ from one another are provided. Balls having a total of six different types A, B, C, D, E, F are employed. Each type exhibits a magnitude of the saturation magnetization $M_1$, $M_2$, $M_3$, $M_4$, $M_5$, $M_6$ that is different from the other types; for example, with reference to the value of pure iron:

| Type | Saturation magnetization | Value |
| --- | --- | --- |
| A | $M_1$ (non-magnetic) | 0% |
| B | $M_2$ | 20% |
| C | $M_3$ | 40% |
| D | $M_4$ | 60% |
| E | $M_5$ | 80% |
| F | $M_6$ (iron) | 100% |

A set 61 with corresponding ferromagnetic articles 63 fashioned as balls is kept on hand in a supply vessel 62. An adequate number of balls is present for each of the types A, B, C, D, E, F, these being selectable for introduction into the tube 45 as needed.

The different saturation magnetizations $M_1$, $M_2$, $M_3$, $M_4$, $M_5$, $M_6$ are obtained by means of a corresponding percentage of steel or iron that is introduced into a non-magnetic matrix, for example a non-magnetic metal. For example, 20-volume % steel or iron in an otherwise non-magnetic ball yield a saturation magnetization of 20% (with reference to steel or iron).

Figure 5:
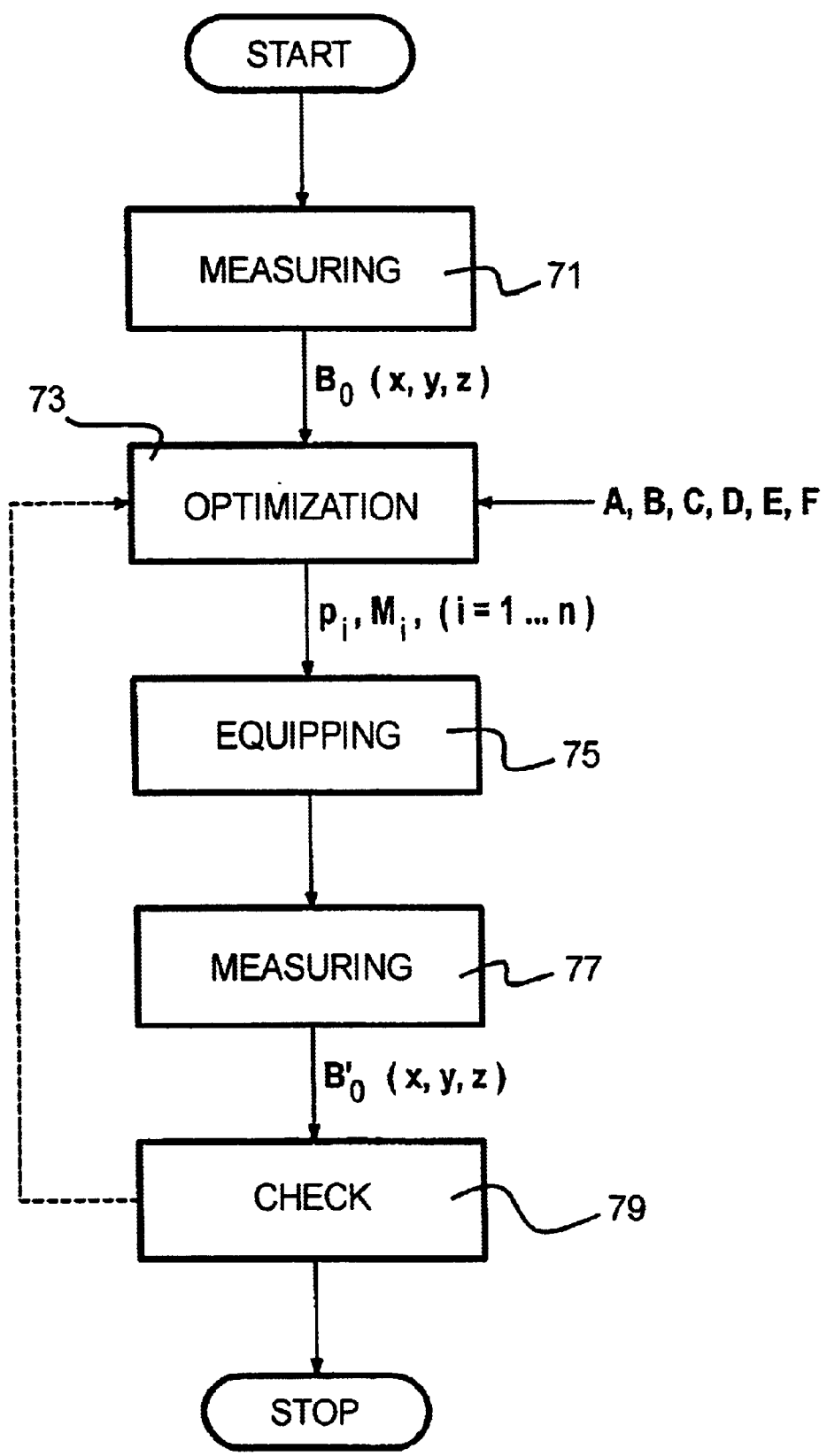
FIG. 5 is a simplified and schematic flowchart of the method of the invention.

FIG. 5 explains the method of the invention in greater detail as an example. The method starts with a first measuring step 71 in which a field distribution $B_0$ (x, y, z) is measured. Subsequently, a field distribution that is optimized in view of the homogeneity of the magnetic field $B_0$ is calculated in an optimization step 73, with the types A, B, C, D, E, F of balls with their different magnetic properties $M_i$ and, optionally, the number n and/or the positions $p_i$ of the balls in the tubes 41, 43, 45 are used as optimization parameters. The optimization step 73 is executed by a software program on a computer.

In a following equipping step 75, balls having the respective calculated saturation magnetization $M_1$, $M_2$, $M_3$, $M_4$, $M_5$, $M_6$ are installed at prescribed positions and/or calculated positions $p_i$. A field distribution $B'_0$ (x, y, z) is measured anew in a following, second measuring step 77, and a decision is made in a check step 79 as to whether an adequate homogeneity of the magnetic field $B_0$ has been achieved, so that the procedure stops, or whether the procedure is successively continued with a further optimization step 73 until the desired homogeneity has been achieved. The check step 79 is likewise executed in the computer, into which the measured field distribution $B'_0$ (x, y, z) is read for this purpose.

Although modifications and changes may be suggested by those skilled in the art, it is the intention of the inventor to embody within the patent warranted hereon all changes and modifications as reasonably and properly come within the scope of his contribution to the art.

I claim as my invention:

1. A facility for generating a uniform magnetic field comprising: a magnet arrangement for generating a magnetic field having a homogeneity; and a shim device for improving said homogeneity comprising a tube mountable relative to said magnet arrangement at a location for interacting with said magnetic field, and a plurality of ferromagnetic rolling bodies disposed in but not attached to said tube, and, at least one non-ferromagnetic rolling body disposed in but not attached to said tube at a selected position in said tube to selectively position said ferromagnetic rolling bodies in said tube.

2. A facility as claimed in claim 1 wherein said ferromagnetic rolling bodies are ferromagnetic balls.

3. A facility as claimed in claim 1 wherein at least two of said ferromagnetic rolling bodies have ferromagnetic properties differing from each other.

4. A facility as claimed in claim 1 wherein at least two of said ferromagnetic rolling bodies have respective saturation magnetizations that differ from each other.

5. A facility as claimed in claim 1 comprising a set of a plurality of different types of ferromagnetic rolling bodies from which said plurality of ferromagnetic rolling bodies in said tube are selected, said types of ferromagnetic rolling bodies in said set respectively differing from each other with regard to a magnitude of a ferromagnetic property.

6. A facility as claimed in claim 5 wherein said types of ferromagnetic rolling bodies differ from each other with regard to a magnitude of saturation magnetization.

7. A facility as claimed in claim 5 wherein said ferromagnetic rolling bodies of said respective types differ in said magnitude of said ferromagnetic property in equidistant steps from type to type.

8. A facility as claimed in claim 5 wherein said different types of ferromagnetic rolling bodies differ as to material composition.

9. A facility as claimed in claim 8 wherein said different types of ferromagnetic rolling bodies are composed of respectively different alloys selected from the group consisting of alloys of iron, alloys of nickel and alloys of cobalt.

10. A facility as claimed in claim 8 wherein said different types of ferromagnetic rolling bodies are respectively composed of different grades of steel.

11. A facility as claimed in claim 1 wherein said magnet arrangement is a magnet arrangement for generating a basic magnetic field in a magnetic resonance examination apparatus.

12. A facility as claimed in claim 1 wherein said plurality of ferromagnetic rolling bodies and said at least one non-ferromagnetic rolling body are disposed in single-file succession in said tube.

13. A facility as claimed in claim 12 wherein said tube has opposite ends and wherein said plurality of ferromagnetic rolling bodies and said at least one non-ferromagnetic rolling body fill said tube substantially from end to end, and wherein said plurality of ferromagnetic rolling bodies are temporarily, non-fixedly held at said selected positions by respective closures at said ends of said tube.

14. A facility as claimed in claim 12 wherein said tube is vertically disposed in said magnetic field, and wherein said plurality of ferromagnetic rolling bodies are temporarily, non-fixedly held at said selected positions by gravity.

15. A method for improving a homogeneity of a magnetic field comprising the steps of: disposing a tube in a volume that is permeable by a magnetic field having a homogeneity, introducing a plurality of ferromagnetic rolling bodies into said tube, for improving said homogeneity without attaching said ferromagnetic rolling bodies to said tube; providing at least two of said ferromagnetic rolling bodies with respective ferromagnetic properties that differ from each other and introducing at least one non-ferromagnetic rolling body into said tube, without attaching said non-ferromagnetic rolling body to said tube, at a selected location to selectively position said ferromagnetic rolling bodies in said tube.

16. A method as claimed in claim 15 wherein the step of providing at least two of said ferromagnetic rolling bodies with respective ferromagnetic properties that differ from each other comprises providing at least two of said ferromagnetic rolling bodies with respectively different saturation magnetization magnitudes.

17. A method as claimed in claim 15 comprising employing ferromagnetic rolling bodies having respectively different material compositions.

18. A method as claimed in claim 15 comprising the additional steps of:
measuring a field distribution of said magnetic field and calculating said homogeneity of said magnetic field dependent on said field distribution;
calculating an optimization of said homogeneity of said magnetic field using said different ferromagnetic properties of said ferromagnetic rolling bodies as optimization parameters; and wherein the step of introducing said ferromagnetic articles into said magnetic field comprises introducing selected ones of said ferromagnetic rolling bodies into said tube having respectively different ferromagnetic properties selected dependent on said optimization at said respective positions relative to said magnetic field.

19. A method as claimed in claim 18 wherein the step of introducing at least one non-ferromagnetic rolling body into said tube comprises introducing a plurality of non-ferromagnetic rolling bodies into said tube to place said ferromagnetic rolling bodies at respective, predetermined positions.

20. A method as claimed in claim 18 wherein the step of calculating said optimization of said homogeneity of said magnetic field comprises additionally employing said respective positions of said ferromagnetic rolling bodies in said optimization parameters, to obtain calculated positions, and wherein the step of introducing at least one non-ferromagnetic rolling body into said tube comprises introducing a plurality of non-ferromagnetic rolling bodies into said tube to place said ferromagnetic rolling bodies respectively at said calculated positions.

21. A method as claimed in claim 18 wherein the step of calculating said optimization of said homogeneity of said magnetic field comprises additionally employing a number of said ferromagnetic articles in said optimization parameters, to obtain a calculated number, and wherein the step of introducing said ferromagnetic rolling bodies into said tube comprises introducing said calculated number of ferromagnetic rolling bodies into said tube and wherein the step of introducing at least one non-ferromagnetic rolling body into said tube comprises introducing a plurality of non-ferromagnetic rolling bodies into said tube to place said calculated number of rolling bodies in said tube respectively at said positions.

22. A method as claimed in claim 18 comprising providing more than two of said ferromagnetic rolling bodies with respectively different ferromagnetic properties, and varying the respective ferromagnetic properties in equidistant steps from ferromagnetic rolling body to ferromagnetic rolling body.

23. A method as claimed in claim 18 comprising introducing said plurality of ferromagnetic rolling bodies introducing said at least one non-ferromagnetic rolling body into said tube in single-file succession.

24. A method as claimed in claim 23 wherein said tube has opposite ends, and comprising the steps of substantially filling said tube from end to end with said plurality of ferromagnetic rolling bodies and said at least one non-ferromagnetic rolling body, and temporarily, non-fixedly maintaining said plurality of ferromagnetic rolling bodies at said selected positions in said tube by closing said ends of said tube.

25. A method as claimed in claim 23 comprising vertically orienting said tube in said magnetic field, and temporarily, non-fixedly maintaining said plurality of ferromagnetic rolling bodies in said tube at said selected positions by gravity.

26. A method as claimed in claim 18 comprising the step of employing ferromagnetic balls as said ferromagnetic rolling bodies and employing a non-ferromagnetic ball as said at least one non-ferromagnetic rolling body.

* * * * *